United States Patent
Choi et al.

(10) Patent No.: US 11,993,695 B2
(45) Date of Patent: May 28, 2024

(54) THERMOPLASTIC RESIN COMPOSITION HAVING EXCELLENT HEAT RESISTANCE AND ELECTROMAGNETIC WAVE SHIELDING CAPACITY, METHOD OF PREPARING THERMOPLASTIC RESIN COMPOSITION, AND INJECTION-MOLDED ARTICLE MANUFACTURED USING THERMOPLASTIC RESIN COMPOSITION

(71) Applicant: LG CHEM, LTD., Seoul (KR)

(72) Inventors: Gi Dae Choi, Daejeon (KR); Youngjoo Kim, Daejeon (KR); Eon Seok Lee, Daejeon (KR); Changhun Yun, Daejeon (KR); Minsu Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 694 days.

(21) Appl. No.: 17/261,250

(22) PCT Filed: Nov. 14, 2019

(86) PCT No.: PCT/KR2019/015571
§ 371 (c)(1),
(2) Date: Jan. 19, 2021

(87) PCT Pub. No.: WO2020/145500
PCT Pub. Date: Jul. 16, 2020

(65) Prior Publication Data
US 2021/0269617 A1    Sep. 2, 2021

(30) Foreign Application Priority Data
Jan. 11, 2019  (KR) .................. 10-2019-0004003

(51) Int. Cl.
*C08K 3/04*     (2006.01)
*B29C 48/00*    (2019.01)
(Continued)

(52) U.S. Cl.
CPC .......... *C08K 3/046* (2017.05); *B29C 48/0022* (2019.02); *B29C 48/40* (2019.02);
(Continued)

(58) Field of Classification Search
CPC .. C08K 3/046; C08K 3/08; C08K 2003/0843; C08K 2003/0856; C08K 2003/0862;
(Continued)

(56) References Cited

U.S. PATENT DOCUMENTS 8,222,321 B2    7/2012  Youm et al.
2004/0077771 A1 4/2004  Wadahara et al.
(Continued)

FOREIGN PATENT DOCUMENTS

CN    102120891    7/2011
CN    102985492    3/2013
(Continued)

OTHER PUBLICATIONS

Machine translation of KR-20160067335-A from IP.com (Year: 2016).*

(Continued)

*Primary Examiner* — Kregg T Brooks
*Assistant Examiner* — David R. Foss
(74) *Attorney, Agent, or Firm* — Bryan Cave Leighton Paisner LLP

(57) ABSTRACT

Provided is a thermoplastic resin composition, including (a) 100 parts by weight of a thermoplastic resin including 80-100% by weight of a base resin and 0-20% by weight of a reinforcing resin; (b) 2-60 parts by weight of linear carbon fibers having an average diameter of 1-15 μm; (c) 1-5 parts by weight of carbon nanofibrils having a BET specific surface area of 200-400 $m^2$/g; (d) 1-15 parts by weight of carbon nanoplates; and (e) 1-25 parts by weight of metal powder, a method of preparing the thermoplastic resin
(Continued)

composition, and an injection-molded article manufactured using the thermoplastic resin composition. The thermoplastic resin composition has excellent mechanical properties, e.g., impact strength, and also excellent conductivity, heat resistance, and electromagnetic wave shielding capacity, particularly high shielding efficiency against high-frequency electromagnetic waves, and thus can be used as automobile, electric, and electronic parts, and as a substitute for aluminum alloys and magnesium alloys.

14 Claims, 1 Drawing Sheet

(51) Int. Cl.
B29C 48/40 (2019.01)
B29C 48/92 (2019.01)
C08K 3/08 (2006.01)
C08K 7/06 (2006.01)
C08L 101/00 (2006.01)
H05K 9/00 (2006.01)
B29K 301/12 (2006.01)

(52) U.S. Cl.
CPC .............. B29C 48/92 (2019.02); C08K 3/08 (2013.01); C08K 7/06 (2013.01); C08L 101/00 (2013.01); H05K 9/009 (2013.01); B29C 2948/92704 (2019.02); B29C 2948/92885 (2019.02); B29K 2301/12 (2013.01); B29K 2995/0011 (2013.01); C08K 2003/0843 (2013.01); C08K 2003/0856 (2013.01); C08K 2003/0862 (2013.01); C08K 2201/001 (2013.01); C08K 2201/003 (2013.01); C08K 2201/006 (2013.01); C08K 2201/01 (2013.01); C08K 2201/011 (2013.01)

(58) Field of Classification Search
CPC ........ C08K 2201/001; C08K 2201/003; C08K 2201/006; B29K 2995/0011
See application file for complete search history.

(56) References Cited

U.S. PATENT DOCUMENTS

| | | | |
|---|---|---|---|
| 2004/0167264 | A1 | 8/2004 | Vathauer et al. |
| 2009/0298990 | A1 | 12/2009 | Kim et al. |
| 2011/0160372 | A1 | 6/2011 | Youm et al. |
| 2013/0177765 | A1 | 7/2013 | Lim et al. |
| 2014/0093712 | A1* | 4/2014 | Tong ................. C08L 69/00 524/440 |
| 2016/0263840 | A1 | 9/2016 | Choi et al. |
| 2017/0260346 | A1* | 9/2017 | Hirata .................. C08J 5/10 |
| 2019/0136047 | A1* | 5/2019 | Heuer ................ C08K 5/1535 |

FOREIGN PATENT DOCUMENTS

| | | | |
|---|---|---|---|
| CN | 106700526 | 5/2017 | |
| JP | 2010-062571 | 3/2010 | |
| JP | 2012-236944 | 12/2012 | |
| KR | 10-2004-0078002 | 9/2004 | |
| KR | 10-2012-0034538 | 4/2012 | |
| KR | 10-1248385 | 4/2013 | |
| KR | 10-2013-0066973 | 6/2013 | |
| KR | 10-1307378 | 9/2013 | |
| KR | 10-2015-0078458 | 7/2015 | |
| KR | 20160067335 A * | 6/2016 | ............... C08K 3/04 |
| KR | 10-2016-0136146 | 11/2016 | |
| KR | 10-2017-0090040 | 8/2017 | |
| KR | 10-2018-0076064 | 7/2018 | |
| WO | WO-2017178583 A1 * | 10/2017 | ........... B29C 48/022 |

OTHER PUBLICATIONS

Ebnesajjad, Sina. (2015). Fluoroplastics, Volume 2—Melt Processible Fluoropolymers—The Definitive User's Guide and Data Book— 5.3 TFE Copolymers. Elsevier. Obtained from Knovel (Year: 2015).*
Hyperion Catalysis International, Inc., "Electrical Resistivity in Semi-Crystalline Polymers as a Function of FIBRIL Nanotube Loadings," Published Aug. 1, 2002, XP055820228, Retrieved from: <https://www.hyperioncatalysis.com/PDFs/perc%20curve-crystalline. pdf [retrieved on Aug. 24, 2021], 2 pages.
Yang et al., "Carbon Nanotubes as Catalyst Support," Published Apr. 19, 2004, XP055820385, Retrieved from: <https://www. hyperioncatalysis.com/PDFs/CNT%20as%20Support.pdf [retrieved on Aug. 24, 2021], 19 pages.

* cited by examiner

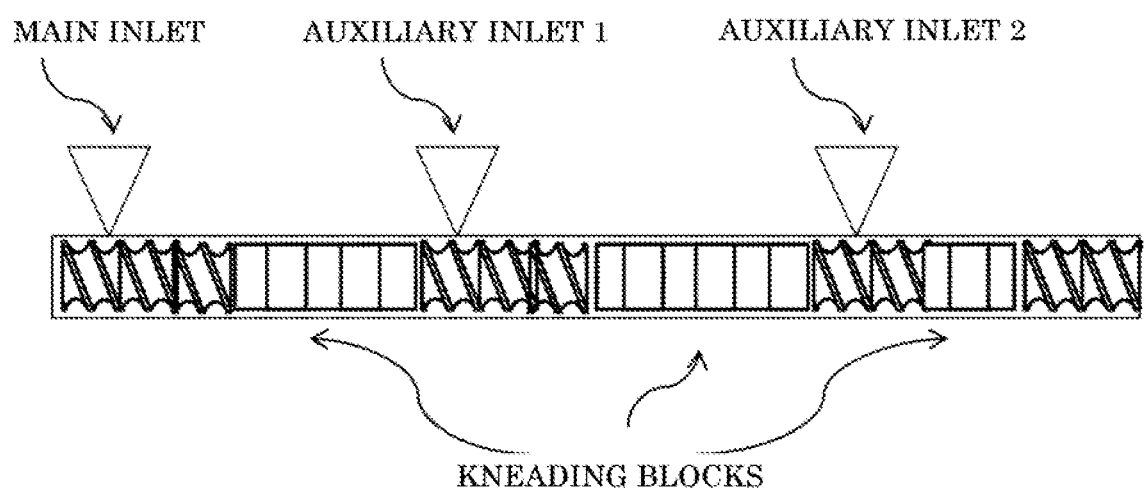

THERMOPLASTIC RESIN COMPOSITION HAVING EXCELLENT HEAT RESISTANCE AND ELECTROMAGNETIC WAVE SHIELDING CAPACITY, METHOD OF PREPARING THERMOPLASTIC RESIN COMPOSITION, AND INJECTION-MOLDED ARTICLE MANUFACTURED USING THERMOPLASTIC RESIN COMPOSITION

CROSS-REFERENCE TO RELATED APPLICATIONS

This application is a National Stage Application of International Application No. PCT/KR2019/015571 filed on Nov. 14, 2019, which claims priority to Korean Patent Application No. 10-2019-0004003, filed on Jan. 11, 2019 in the Korean Intellectual Property Office, the disclosure of which is incorporated herein by reference.

TECHNICAL FIELD

The present invention relates to a thermoplastic resin composition having excellent heat resistance and electromagnetic wave shielding capacity, a method of preparing the same, and an injection-molded article manufactured using the same. More specifically, the present invention relates to a thermoplastic resin composition having excellent mechanical properties, such as impact strength, conductivity, heat resistance, appearance, and electromagnetic wave shielding capacity, especially having high shielding efficiency against high-frequency electromagnetic waves; a method of preparing the thermoplastic resin composition; and an injection-molded article manufactured using the thermoplastic resin composition. With these advantages, the injection-molded article manufactured using the thermoplastic resin composition can be used as automobile parts and electric and electronic parts, and can be used as a substitute for aluminum alloys and magnesium alloys.

BACKGROUND

In response to current market demand, research on miniaturization and high integration of high-performance electronic products is progressing. Accordingly, materials having increased heat resistance and electromagnetic wave shielding performance are required.

Metallic materials, such as aluminum, magnesium, and copper, are widely used in electronic parts because of excellent heat dissipation capacity and electromagnetic wave shielding performance thereof. However, metallic materials have poor moldability and productivity, and thus design of a part may be limited when using the metallic materials.

To solve these problems, a carbon fiber-reinforced thermoplastic resin composition has been developed. Although the conductivity of the thermoplastic resin composition is good, electromagnetic wave shielding performance, appearance, and heat resistance have not been achieved to a required level.

In addition, a method of preparing a resin composition by adding a multi-walled carbon nanotube and a carbon-based conductive additive to a thermoplastic resin such as a polycarbonate resin or a polystyrene resin has been developed. However, electromagnetic wave shielding performance and heat resistance have not been achieved to a required level.

Therefore, there is increasing demand for development of a plastic material for automobile parts and electric and electronic parts having excellent mechanical properties, conductivity, heat resistance, electromagnetic wave shielding capacity, and appearance.

RELATED ART DOCUMENTS

Patent Document—KR 2013-0066973 A

DISCLOSURE

Technical Problem

Therefore, the present invention has been made in view of the above problems, and it is one object of the present invention to provide a thermoplastic resin composition having excellent mechanical properties, such as impact strength, conductivity, heat resistance, appearance, and electromagnetic wave shielding capacity, especially having high shielding efficiency against high-frequency electromagnetic waves; a method of preparing the thermoplastic resin composition; and an injection-molded article manufactured using the thermoplastic resin composition. According to the present invention, the injection-molded article manufactured using the thermoplastic resin composition can be used as automobile parts and electric and electronic parts, and can be used as a substitute for aluminum alloys and magnesium alloys.

The above and other objects can be accomplished by the present disclosure described below.

Technical Solution

In accordance with one aspect of the present invention, provided is a thermoplastic resin composition having excellent heat resistance and electromagnetic wave shielding capacity including (a) 100 parts by weight of a thermoplastic resin including 80 to 100% by weight of a base resin and 0 to 20% by weight of a reinforcing resin; (b) 2 to 60 parts by weight of a linear carbon fiber having an average diameter of 3 to 15 μm; (c) 1 to 5 parts by weight of a carbon nanofibril having a BET specific surface area of 200 to 400 $m^2/g$; (d) 1 to 15 parts by weight of a carbon nanoplate; and (e) 1 to 25 parts by weight of a metal powder.

In accordance with another aspect of the present invention, provided is a method of preparing a thermoplastic resin composition having excellent heat resistance and electromagnetic wave shielding capacity, the method including melt-kneading and extruding (a) 100 parts by weight of a thermoplastic resin including 80 to 100% by weight of a base resin and 0 to 20% by weight of a reinforcing resin; (b) 2 to 60 parts by weight of a linear carbon fiber having an average diameter of 3 to 15 μm; (c) 1 to 5 parts by weight of a carbon nanofibril having a BET specific surface area of 200 to 400 $m^2/g$; (d) 1 to 15 parts by weight of a carbon nanoplate; and (e) 1 to 25 parts by weight of a metal powder at a temperature of 250 to 320° C. and a rate of screw rotation of 250 to 350 rpm using an extruder.

In accordance with yet another aspect of the present invention, provided is an injection-molded article having electromagnetic wave shielding capacity including the thermoplastic resin composition of the present invention.

Advantageous Effects

According to the present invention, a thermoplastic resin composition having excellent mechanical properties, such as impact strength, conductivity, heat resistance, appearance, and electromagnetic wave shielding capacity, especially having high shielding efficiency against high-frequency electromagnetic waves; a method of preparing the thermoplastic resin composition; and an injection-molded article manufactured using the thermoplastic resin composition can be provided. With these advantages, the injection-molded article manufactured using the thermoplastic resin composition can be used as automobile parts and electric and electronic parts, and can be used as a substitute for aluminum alloys and magnesium alloys.

DESCRIPTION OF THE DRAWINGS

FIG. 1 illustrates an extruder equipped with 9 or more kneading blocks, which is used to prepare a thermoplastic resin composition according to the present invention.

DETAILED DESCRIPTION

Hereinafter, a thermoplastic resin composition having excellent heat resistance and electromagnetic wave shielding capacity, a method of preparing the same, and an injection-molded article manufactured using the same according to the present invention will be described in detail.

The present inventors confirmed that, when a thermoplastic resin, such as nylon 66, was mixed with a linear carbon fiber, a carbon nanofibril, a carbon nanoplate, and a metal powder in a predetermined weight ratio to prepare a thermoplastic resin composition, the mechanical properties, such as impact strength, of the prepared thermoplastic resin composition were excellent, and the heat resistance and electromagnetic wave shielding performance thereof were greatly improved. Based on these results, the present inventors conducted further studies to complete the present invention.

The thermoplastic resin composition having excellent heat resistance and electromagnetic wave shielding capacity according to the present invention includes (a) 100 parts by weight of a thermoplastic resin including 80 to 100% by weight of a base resin and 0 to 20% by weight of a reinforcing resin; (b) 2 to 60 parts by weight of a linear carbon fiber having an average diameter of 3 to 15 µm; (c) 1 to 5 parts by weight of a carbon nanofibril having a BET specific surface area of 200 to 400 m$^2$/g; (d) 1 to 15 parts by weight of a carbon nanoplate; and (e) 1 to 25 parts by weight of a metal powder. In this case, conductivity, impact strength, heat resistance, appearance, and electromagnetic wave shielding performance can be excellent.

As another example, the thermoplastic resin composition having excellent heat resistance and electromagnetic wave shielding capacity according to the present invention includes (a) 100 parts by weight of a thermoplastic resin including 80 to 100% by weight of a base resin and 0 to 20% by weight of a reinforcing resin; (b) 2 to 60 parts by weight of a linear carbon fiber; (c) 1 to 5 parts by weight of a carbon nanofibril; (d) 1 to 15 parts by weight of a carbon nanoplate; and (e) 1 to 25 parts by weight of a metal powder. In this case, conductivity, impact strength, heat resistance, appearance, and electromagnetic wave shielding performance can be excellent.

In this specification, unless otherwise defined, the lengths, diameters, and/or thicknesses of 40 specimens are measured using a transmission electron microscope (TEM), and the average length, average diameter, and/or average thickness thereof are the arithmetic mean value calculated from the measured values.

Hereinafter, each component constituting the thermoplastic resin composition having excellent heat resistance and electromagnetic wave shielding capacity according to the present invention will be described in detail.

(a) Base Resin

For example, the base resin of the present invention can include one or more selected from the group consisting of polyamide resins, polycarbonate resins, polyarylene sulfide resins, polystyrene resins, polyolefin resins, polyketone resins, polyphenylene ether resins, and polyester resins. Preferably, the base resin includes one or more selected from the group consisting of polyamide resins, polycarbonate resins, polyphenylene ether resins, and polyester resins. More preferably, the base resin is a polyamide resin. In this case, appearance and electromagnetic wave shielding performance can be excellent, and mechanical properties and heat resistance can be greatly improved.

For example, the polyamide resin can include one or more selected from nylon 4.6, nylon 6, nylon 6.6, nylon 6.10, nylon 7, nylon 8, nylon 9, nylon 11, nylon 12, nylon 46, MXD 6, and a copolymerized polyamide. Preferably, the polyamide resin is nylon 66. In this case, conductivity, impact strength, heat resistance, and electromagnetic wave shielding performance can be excellent.

For example, when relative viscosity is measured using a solution prepared by dissolving 1 g of a polyamide in 100 ml of a 96 wt % aqueous sulfuric acid solution at 20° C., the polyamide resin has a relative viscosity of 1.5 to 5, preferably 2.0 to 4.5, more preferably 2.1 to 2.8. Within this range, conductivity, impact strength, heat resistance, and electromagnetic wave shielding performance can be excellent.

For example, the copolymerized polyamide is a copolymer prepared by polymerizing two or more polyamides, as monomers, of the polyamides.

For example, the polycarbonate resin can have a melt index (MI; measured under conditions of 300° C. and 1.2 kg) of 5 to 40 g/10 minutes or 10 to 35 g/10 minutes, preferably 15 to 30 g/10 minutes. Within this range, conductivity, impact strength, heat resistance, and electromagnetic wave shielding performance can be excellent.

For example, the polyester resin can include one or more selected from polybutylene terephthalates, polyethylene terephthalates, poly(ester)urethanes, and polyetheresters. Preferably, the polyester resin is a polybutylene terephthalate. In this case, appearance and electromagnetic wave shielding performance can be excellent.

For example, the polyester resin can have a melt index (MI; measured under conditions of 250° C. and 2.16 kg) of 5 to 50 g/10 minutes or 10 to 40 g/10 minutes, preferably 15 to 30 g/10 minutes. Within this range, conductivity, impact strength, heat resistance, and electromagnetic wave shielding performance can be excellent.

For example, the polyketone resin can include polyaryletherketones, polyetheretherketones, or mixtures thereof.

For example, the polyphenylene ether resin can include one or more polymers selected from poly(2,6-dimethyl-1,4-phenylene)ether, poly(2,6-diethyl-1,4-phenylene)ether, poly(2,6-dipropyl-1,4-phenylene)ether, poly(2-methyl-6-ethyl-1,4-phenylene)ether, poly(2-methyl-6-propyl-1,4-phenylene)ether, poly(2-ethyl-6-propyl-1,4-phenylene)ether, poly(2,6-diphenyl-1,4-phenylene)ether, poly(2,3,6-trimethyl-1,4-phenylene)-ether, poly(2,3,6-triethyl-1,4-phenylene)ether, and modified polymers thereof, or copolymers including the polymers. Preferably, the polyphenylene ether resin is poly(2,6-dimethyl-1,4-phenylene) ether or a copolymer thereof.

In the present invention, the modified polymer refers to a product prepared by reacting a polymer with a reactive monomer such as an unsaturated carboxylic acid or an anhydride thereof.

For example, the polystyrene resin can include one or more selected from homopolystyrenes, styrene-butadiene-styrene copolymers, styrene-isoprene-styrene copolymers, styrene-ethylene-butadiene-styrene copolymers, and styrene-butadiene copolymers.

For example, the polyarylene sulfide resin can be a polyphenylene sulfide resin.

As a specific example, the polyolefin resin can include one or more selected from the group consisting of polyethylenes, polypropylenes, polybutenes, polymethylpentenes, ethylene-propylene copolymers, and propylene-1-butene copolymers without particular limitation.

For example, the reinforcing resin according to the present invention can be an impact-reinforcing resin. Preferably, the reinforcing resin is a modified polyolefin resin grafted with one or more (hereinafter referred to as 'denaturant') selected from the group consisting of unsaturated carboxylic acids and anhydrides thereof. In this case, impact strength can be greatly improved.

Modification methods commonly used in the art to which the present invention pertains can be used as the grafting method, that is, the modification method, without particular limitation. For example, the modification can be performed using a melt-kneading method, a solution method, or a slurry method.

For example, the melt-kneading method can be a method of melt-kneading a polyolefin resin and a denaturant at a temperature of 150 to 350° C. in the presence of a catalyst for radical polymerization using an extruder.

In addition, the solution method or the slurry method can be a method of adding a polyolefin resin, a denaturant, and a radical polymerization catalyst to an organic solvent such as toluene and xylene to prepare a mixture in a dissolved or slurry state, and then performing a graft (modification) reaction at a temperature of 80 to 350° C. while stirring the mixture.

Unsaturated carboxylic acids commonly used in modification of a polyolefin resin can be used as the unsaturated carboxylic acid without particular limitation. For example, the unsaturated carboxylic acid can include one or more selected from the group consisting of acrylic acid, α-ethyl acrylic acid, methacrylic acid, maleic acid, fumaric acid, halogenated maleic acid, citraconic acid, tetrahydrophthalic acid, methyl tetrahydrophthalic acid, halogenated citraconic acid, crotonic acid, halogenated crotonic acid, itaconic acid, halogenated itaconic acid, and cis-4-cyclohexene-1,2-dicarboxylic acid. Preferably, the unsaturated carboxylic acid is maleic acid.

For example, the polyolefin resin can include one or more selected from the group consisting of polyethylenes, polypropylenes, polybutenes, polymethylpentenes, ethylene-propylene copolymers, and propylene-1-butene copolymers. Preferably, the polyolefin resin can include polyethylenes. In this case, impact strength and electromagnetic wave shielding performance can be improved.

For example, the modified polyolefin resin can be a modified or grafted polymer including a denaturant in an amount of 0.5 to 4% by weight, 0.5 to 3% by weight, 0.5 to 2.5% by weight, or 0.8 to 2% by weight. Within this range, impact strength can be greatly improved.

(b) Linear Carbon Fiber

The linear carbon fiber according to the present invention can have an average diameter of 3 to 15 μm or 5 to 12 μm, preferably 6 to 12 μm, more preferably 5 to 10 μm. Within this range, product strength and shielding performance can be excellent.

For example, the linear carbon fiber can be included in an amount of 2 to 60 parts by weight or 10 to 50 parts by weight, preferably 15 to 40 parts by weight, more preferably 20 to 35 parts by weight, most preferably 30 to 35 parts by weight. Within this range, conductivity, impact strength, heat resistance, appearance, and electromagnetic wave shielding performance can be excellent.

In this specification, the linear carbon fiber refers to a fiber defined or classified as a linear carbon fiber in the art to which the present invention pertains, without particular limitation. In general, the linear carbon fiber refers to a carbon fiber of a straight form as a whole. Specifically, the linear carbon fiber refers to a carbon fiber of a straight form without a spirally or cylindrically curled structure in strands of linear carbon fiber. For example, the linear carbon fiber refers to a straight carbon fiber not including a strand bent at an angle of 90° or more, preferably 30° or more, more preferably 10° or more.

For example, the linear carbon fiber can have an average length of 0.1 to 12 mm, 0.2 to 9 mm, or 0.3 to 6 mm. Within this range, conductivity, impact strength, heat resistance, appearance, and electromagnetic wave shielding performance can be excellent.

For example, the linear carbon fiber can be a large-tow fiber of 10 to 100 k or 40 to 60 k. Within this range, conductivity, impact strength, heat resistance, appearance, and electromagnetic wave shielding performance can be excellent. Here, 1 k means 1,000 short fiber strands.

(c) Carbon Nanofibril

The carbon nanofibril according to the present invention can have a BET specific surface area of 180 to 600 $m^2/g$, preferably 200 to 500 $m^2/g$, more preferably 200 to 400 $m^2/g$. Within this range, conductivity, heat resistance, and shielding performance can be excellent.

In this specification, the BET specific surface area is defined as a specific surface area measured according to a BET method, and is measured using a Brunauer-Emmett-Teller method (according to ASTM 6556) using nitrogen adsorption.

For example, the carbon nanofibril can be included in an amount of 1 to 5 parts by weight, preferably 1 to 4 parts by weight, more preferably 1 to 3 parts by weight, most preferably 1 to 2 parts by weight. Within this range, conductivity, impact strength, heat resistance, appearance, and electromagnetic wave shielding performance can be excellent.

For example, the carbon nanofibril can have an average diameter of 4 to 30 nm or 5 to 20 nm and an aspect ratio of 80 to 500. Within this range, conductivity, impact strength, heat resistance, appearance, and electromagnetic wave shielding performance can be excellent.

In this specification, the aspect ratio of the carbon nanofibril means a ratio between width to length in a horizontal section, and is represented by the ratio value (b/a) of the longer one (2b) of width and length to the shorter one (2a) of the width and the length.

For example, the carbon nanofibril can have an average length of 1 to 500 μm or 2 to 200 μm. Within this range, conductivity, impact strength, heat resistance, appearance, and electromagnetic wave shielding performance can be excellent.

In this specification, when the average diameter, average aspect ratio, and average length of the carbon nanofibril are determined, the diameters, aspect ratios, and lengths of 40 specimens are measured using a scanning electron microscope (SEM), and the average diameter, average aspect ratio, and average length thereof are the arithmetic mean value calculated from the measured values.

(d) Carbon Nanoplate

For example, the carbon nanoplate according to the present invention can be included in an amount of 1 to 15 parts by weight, 1 to 10 parts by weight, or 2 to 10 parts by weight, preferably 3 to 10 parts by weight, more preferably 5 to 10 parts by weight, most preferably 3 to 5 parts by weight. Within this range, tensile strength and impact strength can be improved, and heat resistance can be excellent.

For example, the carbon nanoplate of (d) can be a plate-shaped carbon nanomaterial having an average thickness of 2 to 50 nm. As a specific example, the carbon nanoplate can include one or more selected from exfoliated graphite, graphene nanoplates, and exfoliated and expanded graphite. In this case, tensile strength and impact strength can be improved, and heat resistance can be excellent.

In this specification, when the average thickness of the carbon nanoplate is determined, the thicknesses of 40 specimens are measured using a scanning electron microscope (SEM), and the average thickness thereof is the arithmetic mean value calculated from the measured values.

(e) Metal Powder

For example, the metal powder according to the present invention can be included in an amount of 1 to 25 parts by weight or 1 to 20 parts by weight, preferably 3 to 20 parts by weight, more preferably 5 to 20 parts by weight, most preferably 10 to 20 parts by weight. Within this range, conductivity, impact strength, heat resistance, appearance, and electromagnetic wave shielding performance can be excellent.

For example, the metal powder of (e) can be a magnetic metal powder. Preferably, the metal powder includes metal powders obtained from one or more selected from iron (Fe), cobalt (Co), and nickel (Ni), more preferably a nickel (Ni) metal powder. In this case, conductivity, impact strength, heat resistance, appearance, and electromagnetic wave shielding performance can be excellent.

For example, the metal powder of (e) can have an average diameter of 1 to 100 μm, preferably 20 to 80 μm, more preferably 30 to 70 μm, most preferably 40 to 60 μm. Within this range, conductivity, impact strength, heat resistance, appearance, and electromagnetic wave shielding performance can be excellent.

In this specification, when the average diameter of the metal powder is determined, the diameters of 40 specimens are measured using a transmission electron microscope (TEM), and the average diameter thereof is the arithmetic mean value calculated from the measurement results.

For example, the metal powder of (e) can be a metal powder coated with an organic binder. Organic binders, e.g., stearic acid, commonly used in the art to which the present invention pertains can be used as the organic binder without particular limitation.

For example, a total weight of the components of (b), (c), (d), and (e) can be 5 to 80 parts by weight, or 20 to 70 parts by weight, preferably 30 to 60 parts by weight, more preferably 36 to 55 parts by weight, most preferably 48 to 55 parts by weight. Within this range, tensile strength, impact strength, conductivity, heat resistance, appearance, and electromagnetic wave shielding performance can be excellent.

Additives

For example, the thermoplastic resin composition of the present invention can further include one or more additives selected from the group consisting of flame retardants, nucleating agents, UV absorbents, antioxidants, dust removing agents, antimicrobials, repellents, deodorants, anti-coloring agents, heat stabilizers, release agents, antistatic agents, plasticizers, lubricants, coloring agents, pigments, dyes, blowing agents, anti-foaming agents, coupling agents, and inorganic fillers, as needed.

For example, the additives can be included in an amount of 0.1 to 20 parts by weight, preferably 0.1 to 10% parts by weight. Within this range, the properties of the additives can be sufficiently expressed without disturbing the physical properties of a resin composition.

Flame retardants commonly used in the art to which the present invention pertains can be used as the flame retardant of the present invention without particular limitation. As a specific example, the flame retardant can include one or more selected from halogen-based flame retardants such as tetrabromobisphenol A (TBBA), phosphorus-based flame retardants such as alkyl phosphate and allyl phosphate, and inorganic flame retardants such as magnesium hydroxide and aluminum hydroxide.

Inorganic fillers containing inorganic components excluding carbon can be used as the inorganic fillers without particular limitation.

Other additives commonly used in the art to which the present invention pertains can be used in the present invention without particular limitation.

It will be apparent to those skilled in the art that various changes and modifications can be made without departing from the spirit and scope of the present invention, and such changes and modifications are also within the scope of the appended claims.

Thermoplastic Resin Composition

For example, the thermoplastic resin composition according to the present invention can have a heat distortion temperature of 150° C. or more and an electromagnetic wave shielding dB value (@ 1 GHz) of 47 or more. Preferably, when the heat distortion temperature is 150 to 250° C., an electromagnetic wave shielding dB value is 47 to 60. More preferably, when the heat distortion temperature is 215 to 250° C., an electromagnetic wave shielding dB value is 50 to 60. Most preferably, when the heat distortion temperature is 240 to 245° C., an electromagnetic wave shielding dB value is 50 to 55. Within this range, mechanical properties, conductivity, and appearance can be excellent.

For example, when Notched Izod impact strength is measured according to an ISO 180A method under a condition of specimen thickness of 4 mm, the thermoplastic resin composition can have a Notched Izod impact strength of 70 kJ/m$^2$ or more, preferably 70 to 120 kJ/m$^2$, more preferably 80 to 120 kJ/m$^2$. Within this range, conductivity, heat resistance, appearance, and electromagnetic wave shielding performance can be excellent.

Method of Preparing Thermoplastic Resin Composition

A method of preparing a thermoplastic resin composition having excellent heat resistance and electromagnetic wave shielding capacity according to the present invention includes a step of melt-kneading and extruding a composition comprising (a) 100 parts by weight of a thermoplastic resin including 80 to 100% by weight of a base resin and 0 to 20% by weight of a reinforcing resin; (b) 2 to 60 parts by weight of a linear carbon fiber having an average diameter of 3 to 15 μm; (c) 1 to 5 parts by weight of a carbon nanofibril having a BET specific surface area of 200 to 400 m$^2$/g; (d) 1 to 15 parts by weight of a carbon nanoplate; and (e) 1 to 25 parts by weight of a metal powder at a temperature of 250 to 320° C. and a rate of screw rotation of 250 to 350 rpm using an extruder. A thermoplastic resin composition prepared using the method can have excellent conductivity, impact strength, heat resistance, appearance, and electromagnetic wave shielding performance.

FIG. 1 illustrates an extruder equipped with 9 or more kneading blocks, which is used to prepare a thermoplastic resin composition according to the present invention. The present invention will be described with reference to FIG. 1.

The type of extruder is not particularly limited, and an extruder commonly used in the art can be appropriately selected and used. For example, a single-screw extruder equipped with one screw or a multi-screw extruder equipped with a plurality of screws can be used. Considering uniform kneading of materials, ease of processing, and economic efficiency, a twin-screw extruder equipped with two screws is preferably used.

A typical extruder includes a raw material feeder for feeding materials into a barrel, also called a cylinder, a screw for conveying and kneading the fed materials, and a die for extruding the kneaded materials. In this case, the screw consists of a plurality of screw elements for various functions.

In the typical extruder, one or more raw material feeders can be provided, and two or more or three raw material feeders can be provided, as needed. In addition, a main inlet can be provided, and two or more or three auxiliary inlets can be optionally provided.

As a specific example, a thermoplastic resin, a linear carbon fiber, a carbon nanofibril, a carbon nanoplate, and a metal powder can be fed into the main inlet batchwise. As another example, a thermoplastic resin can be fed into the main inlet, and then a linear carbon fiber, a carbon nanofibril, a carbon nanoplate, and a metal powder can be fed to the auxiliary inlets.

As another example, a thermoplastic resin can be fed into the main inlet, some of a linear carbon fiber, a carbon nanofibril, a carbon nanoplate, and a metal powder can be fed into an auxiliary inlet 1, and then the remainder can be fed into an auxiliary inlet 2.

As another example, a thermoplastic resin can be fed into the main inlet, a linear carbon fiber, a carbon nanofibril, a carbon nanoplate, and a metal powder can be fed into the auxiliary inlet 1, and additives such as an antioxidant and a heat stabilizer can be fed into the auxiliary inlet 2.

The kneading blocks of the present invention correspond to the screw elements. Specifically, each kneading block consists of a plurality of discs, preferably 3 to 7 discs, 5 to 7 discs, 3 to 5 discs, or 4 to 5 discs, and has a polygonal cross section or an elliptical cross section. The kneading blocks are arranged continuously in a direction in which materials are conveyed. In addition, in the kneading block, the phase angle of the discs (indicating the travel angle between discs) is generally 45 to 90°.

In addition, the kneading block includes a forward kneading block capable of conveying, distributing, and mixing materials, a neutral kneading block capable of distributing and mixing materials without conveying capacity, and a backward kneading block capable of conveying materials in a direction opposite to the conveying direction.

For example, the thermoplastic resin composition according to the present invention can be prepared using a method including a step of performing kneading and extruding using an extruder equipped with 9 or more, 10 or more, 10 to 18, or 12 to 16 kneading blocks. In this case, it can be effective to arrange the kneading blocks in the order of forward kneading blocks, neutral kneading blocks, and backward kneading blocks with respect to a resin flow direction. Depending on combination manners, a continuous or separate block combination can be used. In this case, dispersibility and compatibility can be further improved, and thus a high-quality thermoplastic resin composition can be provided.

9 or more kneading blocks can be arranged continuously, or can be arranged discontinuously between screws. As a specific example, 3 to 6 kneading blocks can be provided continuously between the main inlet and the auxiliary inlet 1, 3 to 8 kneading blocks can be provided continuously between the auxiliary inlet 1 and the auxiliary inlet 2, and 2 to 5 kneading blocks can be provided between the auxiliary inlet 2 and an outlet (not shown). With this configuration, local heat generation during melt-kneading can be controlled to prevent heat distortion of raw materials. In addition, excessive cutting of a linear carbon fiber and a carbon nanofibril can be prevented, thereby improving conductivity and physical properties.

The step of kneading and extruding can be performed at a barrel temperature of 250 to 320° C., 280 to 310° C., or 290 to 310° C. In this case, a treatment amount per unit time can be appropriate, and at the same time melt kneading can be sufficiently performed. In addition, problems such as thermal decomposition of resin components can be prevented.

In addition, the step of kneading and extruding can be performed at a rate of screw rotation of 250 to 350 rpm or 250 to 310 rpm. In this case, a treatment amount per unit time can be appropriate. Thus, process efficiency can be excellent, and excessive cutting of a conductive filler (a carbon nanofibril and the like) can be prevented, thereby improving the conductivity of a final product.

For example, the method of preparing the thermoplastic resin composition can include a step of obtaining pellets by cutting an extrudate using a pelletizer after extruding. In this case, handling can be easy, and an electromagnetic wave shielding injection-molded article can be easily manufactured through injection molding.

Details of components (a) to (e) are the same as the above description, and thus description thereof will be omitted.

Injection-Molded Article

The injection-molded article of the present invention includes the above-described thermoplastic resin composition.

For example, the injection-molded article can be manufactured by injection-molding the thermoplastic resin composition having excellent heat resistance and electromagnetic wave shielding capacity according to the present invention at a barrel temperature of 250 to 300° C. and a mold temperature of 60 to 100° C. The manufactured injection-molded article can have a heat distortion temperature of 150° C. or more and an electromagnetic wave shielding dB (@ 1 GHz) value of 47 or more or 47 to 60, preferably 50 to 60, more preferably 50 to 55.

For example, the injection-molded article can include automobile parts or electric and electronic parts. In particular, the injection-molded article can be used as a substitute for a metallic part such as aluminum alloys and magnesium alloys used to manufacture electronic part covers, circuit parts, inverter covers, and the like.

Hereinafter, the present invention will be described in more detail with reference to the following examples. However, these examples are provided for illustrative purposes only and should not be construed as limiting the scope and spirit of the present invention. In addition, it will be apparent to those skilled in the art that various changes and modifications can be made without departing from the spirit and scope of the present invention, and such changes and modifications are also within the scope of the appended claims.

EXAMPLES

Components used in Examples and Comparative Examples below are as follows.

(a1) A nylon 66 resin (product number: 3600; relative viscosity: 2.4; number average molecular weight: 14,000 g/mol; Invista Co.) was used.

(a2) A polycarbonate resin (product number: 1330; melt index (300° C.; 1.2 kg): 30 g/10 minutes; LG Chemical Co.) was used.

(a3) A polybutylene terephthalate resin (product number: GP2000; melt index (250° C.; 2.16 kg): 30 g/10 minutes; LG Chemical Co.) was used.

(a4) A polyethylene resin modified with 0.5 to 2% by weight of maleic anhydride was used.

(a5) Poly(2,6-dimethyl-1,4-phenylene)ether (product number: 201A; Asahi Chemical Co.) was used as a polyphenylene ether resin.

(b) Pyrofil (average diameter: 7 μm; 50 k large tow product; Zoltek Co.) was used as a carbon fiber.

(c) CP1002M (BET specific surface area: 200 to 300 m$^2$/g; average diameter: 10 to 15 nm, carbon purity: 95% by weight; LG Chemical Co.) was used as a carbon nanofibril.

(d) CB-100 (a plate-shaped graphite product; Japan Graphite Co., Ltd.) was used as a carbon nanoplate.

(e) A nickel metal powder having an average diameter of 50 μm was used a metal powder.

Examples 1 to 6 and Comparative Examples 1 to 4

According to the composition shown in Table 1 below, each component was fed into a twin-screw extruder, melt-kneading and extruding were performed at a temperature of 250 to 320° C. and a screw rotation rate of 300 revolutions/minute, and a discharged extrudate was cut using a pelletizer to obtain pellets. Then, the obtained pellets were injection-molded using an injection machine (80 tons; Engel Co.) at an injection temperature (barrel temperature) of 250 to 300° C. and a mold temperature of 70 to 100° C. to prepare specimens for measuring physical properties.

Test Examples

The properties of the specimens prepared in Examples 1 to 6 and Comparative Examples 1 to 4 were measured using the following methods, and the results are shown in Table 1.

1) Tensile strength and elongation: Tensile strength and elongation were measured according to ASTM D638. In this case, specimen thickness was 3.2 mm, a measurement speed was 5 mm/min, and a measurement unit was MPa.

2) Impact strength: A specimen having a thickness of 4 mm was notched, and the Notched Izod impact strength of the specimen was measured according to ISO 180A at room temperature (23° C.). In this case, a measurement unit was kJ/m$^2$.

3) Heat distortion temperature: Heat distortion temperature was measured under a stress of 0.45 MPa according to ISO 75-2. In this case, specimen thickness was 4 mm, and measurement unit was ° C.

4) Surface resistance: Surface resistance was measured using a PRS-801 (Prostat Co.).

5) Electromagnetic wave shielding: Shielding degree was measured at 1 GHz using an EM2107A (Electro-metrics Co.).

6) Appearance: The appearance of the injection specimen was evaluated by visual observation. In this case, a case of excellent moldability and appearance was marked with ◯, a case of good appearance was marked with Δ, a case of poor appearance was marked with X, and a case of very poor appearance was marked with XX.

TABLE 1

| Classification | | Example 1 | Example 2 | Example 3 | Example 4 | Example 5 | Example 6 | Comparative Example 1 | Comparative Example 2 | Comparative Example 3 | Comparative Example 4 |
|---|---|---|---|---|---|---|---|---|---|---|---|
| Composition | (a1) | 100 | 100 | 90 | | | 80 | 100 | 100 | | |
| | (a2) | | | | 100 | | | | | 100 | |
| | (a3) | | | | | 100 | | | | | 100 |
| | (a4) | | | 10 | | | 10 | | | | |
| | (a5) | | | | | | 10 | | | | |
| | (b) | 35 | 30 | 30 | 20 | 30 | 30 | 40 | 30 | 20 | 30 |
| | (c) | 1 | 2 | 2 | 1 | 1 | 2 | | | 7 | |
| | (d) | 3 | 3 | 3 | 10 | 5 | 5 | | 5 | | |
| | (e) | 10 | 20 | 20 | 5 | 10 | 10 | 5 | | | 5 |
| Physical properties | Tensile strength (MPa) | 180 | 170 | 160 | 140 | 150 | 150 | 180 | 170 | 120 | 140 |
| | Impact strength (J/m) | 80 | 70 | 120 | 70 | 85 | 95 | 80 | 70 | 60 | 80 |
| | Heat distortion temperature (° C.) | 245 | 245 | 240 | 150 | 215 | 210 | 245 | 240 | 140 | 210 |
| | Surface resistance (Ohm/sq) | $10^1$ | $10^2$ | $10^2$ | $10^2$ | $10^2$ | $10^1$ | $10^2$ | $10^2$ | $10^1$ | $10^3$ |
| | Electromagnetic wave shielding (dB) | 55 | 50 | 52 | 50 | 50 | 53 | 42 | 38 | 43 | 38 |
| | Appearance | ◯ | ⊚ | ◯ | ◯ | ◯ | ◯ | X | Δ | XX | ◯ |

As shown in Table 1, it can be confirmed that the thermoplastic resin compositions (see Examples 1 to 6) according to the present invention including all of the components (b) to (e) according to the present invention have increased tensile strength, impact strength, heat distortion temperature (heat resistance), and conductivity and excellent appearance and electromagnetic wave shielding performance, compared to the thermoplastic resin compositions (see Comparative Examples 1 to 4) in which some of the components (b) to (e) is excluded. In particular, it can be confirmed that, in the cases of Examples 1 to 3 in which nylon 66 is included and a total weight of the components (b) to (e) is within a range of 48 to 55 parts by weight, tensile strength, heat resistance, and electromagnetic wave shielding performance are greatly improved.

The invention claimed is:

1. A thermoplastic resin composition having excellent heat resistance and electromagnetic wave shielding capacity, comprising:
   (a) 100 parts by weight of a thermoplastic resin comprising 80 to 90% by weight of a base resin and 10 to 20% by weight of an impact-reinforcing resin that is a modified polyolefin resin grafted with one or more unsaturated carboxylic acids or anhydrides thereof;
   (b) 2 to 60 parts by weight of a linear carbon fiber having an average diameter of 3 to 15 μm;
   (c) 1 to 5 parts by weight of a carbon nanofibril having a BET specific surface area of 200 to 400 m$^2$/g;
   (d) 1 to 15 parts by weight of a carbon nanoplate; and
   (e) 1 to 25 parts by weight of a metal powder.

2. The thermoplastic resin composition according to claim 1, wherein a total weight of the components of (b), (c), (d), and (e) is 5 to 80 parts by weight.

3. The thermoplastic resin composition according to claim 1, wherein the base resin comprises one or more selected from the group consisting of polyamide resins, polycarbonate resins, polyarylene sulfide resins, polystyrene resins, polyolefin resins, polyketone resins, and polyester resins.

4. The thermoplastic resin composition according to claim 1, wherein the carbon nanoplate has an average thickness of 2 to 50 nm.

5. The thermoplastic resin composition according to claim 1, wherein the metal powder is a magnetic metal powder.

6. The thermoplastic resin composition according to claim 5, wherein the magnetic metal powder comprises one or more selected from the group consisting of an iron powder, a cobalt powder, and a nickel powder.

7. The thermoplastic resin composition according to claim 1, wherein the metal powder has an average diameter of 1 to 100 μm.

8. The thermoplastic resin composition according to claim 1, further comprising one or more additives selected from the group consisting of flame retardants, nucleating agents, UV absorbents, antioxidants, dust removing agents, antimicrobials, repellents, deodorants, anti-coloring agents, heat stabilizers, release agents, antistatic agents, plasticizers, lubricants, coloring agents, pigments, dyes, blowing agents, anti-foaming agents, coupling agents, and inorganic fillers.

9. The thermoplastic resin composition according to claim 1, wherein the thermoplastic resin composition has a heat distortion temperature of 150° C. or more and an electromagnetic wave shielding dB value of 47 or more.

10. The thermoplastic resin composition according to claim 1, wherein, when Notched Izod impact strength is measured under a condition of specimen thickness of 4 mm according to an ISO 180A method, the thermoplastic resin composition has a Notched Izod impact strength of 70 kJ/m$^2$ or more.

11. An injection-molded article having electromagnetic wave shielding capacity, comprising the thermoplastic resin composition of claim 1.

12. The thermoplastic resin composition according to claim 1, wherein the metal powder comprises an iron powder.

13. A method of preparing a thermoplastic resin composition having excellent heat resistance and electromagnetic wave shielding capacity, the method comprising melt-kneading and extruding a composition comprising:
   (a) 100 parts by weight of a thermoplastic resin comprising 80 to 90% by weight of a base resin and 10 to 20% by weight of an impact-reinforcing resin that is a modified polyolefin resin grafted with one or more unsaturated carboxylic acids or anhydrides thereof;
   (b) 2 to 60 parts by weight of a linear carbon fiber having an average diameter of 3 to 15 μm;
   (c) 1 to 5 parts by weight of a carbon nanofibril having a BET specific surface area of 200 to 400 m$^2$/g;
   (d) 1 to 15 parts by weight of a carbon nanoplate; and
   (e) 1 to 25 parts by weight of a metal powder
at a temperature of 250 to 320° C. and a rate of screw rotation of 250 to 350 rpm using an extruder to form the thermoplastic resin composition as an extrudate.

14. The method according to claim 13, comprising obtaining pellets by cutting the extrudate using a pelletizer after the melt-kneading and extruding.

* * * * *